United States Patent
Brofman et al.

(10) Patent No.: US 6,584,684 B2
(45) Date of Patent: Jul. 1, 2003

(54) METHOD FOR ASSEMBLING A CARRIER AND A SEMICONDUCTOR DEVICE

(75) Inventors: Peter J. Brofman, Hopewell Junction, NY (US); Anson J. Call, Poughkeepsie, NY (US); Jeffrey T. Coffin, Pleasant Valley, NY (US); Kathleen A. Stalter, Hopewell Junction, NY (US)

(73) Assignee: International Business Machines, Armonk, NY (US)

( * ) Notice: Subject to any disclaimer, the term of this patent is extended or adjusted under 35 U.S.C. 154(b) by 277 days.

(21) Appl. No.: 09/804,885

(22) Filed: Mar. 13, 2001

(65) Prior Publication Data

US 2001/0007288 A1 Jul. 12, 2001

Related U.S. Application Data

(62) Division of application No. 09/233,890, filed on Jan. 20, 1999, now Pat. No. 6,218,629.

(51) Int. Cl.[7] ................................................. H05K 3/34
(52) U.S. Cl. .......................... 29/840; 29/830; 29/831; 29/834; 29/836; 29/841; 156/272.2; 156/274.4; 228/175; 228/180.21; 228/180.22
(58) Field of Search ..................... 156/272.2, 274.4, 156/274.8, 275.3, 291, 330; 29/830, 831, 832, 834, 836, 840, 841, 842, 843, 854; 438/106–127, 118, 466; 174/257, 259, 260, 262, 264; 361/767, 768, 771, 783; 257/698; 228/175, 180.21, 180.22

(56) References Cited

U.S. PATENT DOCUMENTS

| | | | |
|---|---|---|---|
| 4,427,481 A | 1/1984 | Smith et al. ............. 156/306.6 |
| 4,548,862 A | 10/1985 | Hartman ...................... 426/323 |
| 4,606,962 A * | 8/1986 | Reylek et al. ............... 428/148 |
| 5,019,944 A | 5/1991 | Ishii et al. .................... 361/400 |
| 5,045,249 A | 9/1991 | Jin et al. ....................... 264/24 |
| 5,188,984 A * | 2/1993 | Nishiguchi ................... 438/125 |
| 5,534,094 A * | 7/1996 | Arjavalingam et al. ..... 156/155 |
| 5,543,585 A | 8/1996 | Booth et al. ................. 174/261 |
| 5,962,815 A | 10/1999 | Lan et al. .................... 124/262 |
| 6,284,086 B1 * | 9/2001 | Cardellino et al. ...... 156/273.7 |
| 6,380,494 B1 * | 4/2002 | Mays et al. .................. 174/260 |
| 6,409,866 B1 * | 6/2002 | Yamada ....................... 156/219 |
| 6,410,366 B1 * | 6/2002 | Hashimoto ................... 438/125 |
| 6,414,397 B1 * | 7/2002 | Sawamoto .................... 257/783 |

OTHER PUBLICATIONS

Kang et al., "Development of High Conductivity Lead (Pb)–Free Conducting Adhesives", IEEE Transactions on Components, Packaging, and Manufacturing Technology—Part A, vol. 21, No. 1, pp. 18–22 (Mar. 1998).*

* cited by examiner

Primary Examiner—Peter Vo
Assistant Examiner—David Tuan Nguyen
(74) Attorney, Agent, or Firm—RatnerPrestia; Ira D. Blecker, Esq.

(57) ABSTRACT

A module or assembly is formed by interposing a polymer between a carrier and a semiconductor device to be secured to the carrier. The polymer has ionized metallic particles suspended in it. Before setting or curing the polymer, the module is exposed to an electric field which induces migration of the metallic particles to the opposing pads of the carrier and semiconductor device. Such migration ultimately forms metal dendrites extending between mating pad pairs. The dendrites establish a metallurgical bond and conductive paths between the carrier and the overlying semiconductor device. When the polymer is subsequently set, the carrier and device are not only adhered to each other, but the dendrite connections are fixed and structurally reinforced to provide the needed electrically conductive paths.

16 Claims, 2 Drawing Sheets

METHOD FOR ASSEMBLING A CARRIER AND A SEMICONDUCTOR DEVICE

This application a divisional of U.S. patent application Ser. No. 09/233,890, filed on Jan. 20, 1999, now U.S. Pat. No. 6,218,629.

TECHNICAL FIELD

The present invention relates generally to electronic packaging and, more particularly, to a semiconductor module and related method for electrical interconnection between a chip and the substrate of the module.

BACKGROUND OF INVENTION

One common method for electrically interconnecting a semiconductor device to an associated carrier or substrate is the flip chip attachment method. Flip chip attachment generally is accomplished by controlled collapse chip connection ("C4"). In the C4 method, small solder balls are reflowed to form the connection between matching metallized input/output (I/O) pads on both the chip and carrier mating surfaces.

The C4 attachment technology, as practiced today, has several limitations: (1) sensitivity of the current practice to irregularities in the carrier surface; (2) the requirement for a joining temperature in excess of 300° C. to melt the high-lead-content solder generally used; (3) relatively complex and costly processing steps; and (4) the general need to use lead-based solder (which may be regulated in the future due to environmental legislation).

Other electrical interconnect methods are available, but are either not well-suited for certain applications or suffer from their own drawbacks and disadvantages. For example, U.S. Pat. No. 5,045,249 issued to Jin et al. teaches electrical interconnection through a polymer medium in which electrically conductive magnetic particles are aligned using a strong magnetic field. The particles are made to penetrate the surfaces of the polymer film, offering conductive paths to mechanically connect to mating pads. One disadvantage to this method is that the connections formed by the method are merely mechanical (the connections are formed by contact of adjacent surfaces) rather than metallurgical (connections formed by fusing adjacent metal surfaces together at a molecular level). Such mechanical connections are generally not sufficiently reliable for many applications.

U.S. Pat. No. 5,019,944 issued to Ishii et al. teaches attaching pre-existing, metallic contacts to the pads of one of the opposing surfaces to be joined, and then pressing these conductive contacts through an uncured polymer film and against corresponding mating pads of the other opposing surface to be joined. To maintain the contact, the polymer is cured. Again, this process relies on a less reliable mechanical bond rather than a metallurgical bond. Furthermore, the ability to make robust connections under this method is likely to be sensitive to irregularities in one or both of the mating surfaces.

U.S. Pat. No. 4,548,862 issued to Hartman teaches a process for building a pressure-sensitive adhesive film. Anisotropic conductive paths are fabricated in the film through use of a magnetic field to align pre-existing particles embedded in the film before curing. Once again, this method disadvantageously provides only a mechanical rather than a metallurgical bond.

Another electrical interconnection method is disclosed in the IEEE publication titled "Development of High Conductivity Lead (Pb)-Free Conducting Adhesives," by Kang et al., in IEEE Transactions on Components, Packaging, and Manufacturing Technology-Part A, Vol. 21, No. 1, pages 18–22 (March 1998). The method disclosed uses tin-coated metal particles embedded in a thermoplastic polyimide-siloxane copolymer material that can be heated to allow the tin on the particles to melt and combine metallurgically with the mating I/O pads and each other. As the thermoplastic is cooled, the polymer solidifies, freezing in place the joined particles. This practice still requires relatively high-temperature reflow to melt the tin-based particles. Furthermore, the volume of particles available for electrical connection is limited because the process erects no barrier to lateral particle interconnect that can cause shorting between pads. The need to limit metal particle volume, in turn, limits the conductivity achievable by this approach.

There is thus a need for a relatively low-cost semiconductor module and related manufacturing method for interconnecting a chip of such a module to the carrier of the module. There is a further need for the module to have robust, metallurgical connections as opposed to mechanical bonds or connections. There is a still further need for the interconnections to be tolerant of surface irregularities. There is yet a further need for the interconnections to be accomplished with less or without lead-based solder.

SUMMARY OF THE INVENTION

To meet these and other needs, and in view of its purposes, the present invention provides a method for assembling a carrier and a semiconductor device to each other. A die-attach polymer is used to adhere the device and carrier and electrically interconnect those components. The die-attach polymer includes a low density of ionized metallic particles and is applied to one or both of the surfaces to be mated to each other.

The resulting assembly is exposed to an electric field of sufficient strength to produce a controlled migration of the metallic particles to the pads of the semiconductor device, the carrier, or both components. Such migration forms anisotropic metal dendrites extending from the pads. The dendrites establish a conductive path and a metallurgical bond between the carrier and the device. Once sufficient conductive paths have been formed by the dendrites, the polymer is caused to set so as to structurally reinforce and electrically insulate from each other the metal dendrites of adjacent pads.

In one preferred embodiment of the present invention, the die-attach polymer is formed with ionic metallic particles in a size range of about 1 to about 25 micrometers, and in a volume fraction of about 5% to about 20%, which has been found to minimize instances of lateral conduction. The metallic particles may be silver, copper, or nickel, although other metals are also suitable. The polymer is advantageously applied as a film to the surface or surfaces to be joined.

In accordance with another aspect of the present invention, a small concentration of a metallic salt is also added to the polymer, preferably in a concentration of about 0.1% to about 1.0% by weight of the metallic particles in the polymer. In accordance with still another aspect of the invention, a structure is added to inhibit certain undesired migrations of the metallic particles during the application of the electric field. One form of this inhibiting structure is a planar spacer of insulating material with passages through the mater al at locations corresponding to the pads. The spacer is placed between the carrier and the semiconductor device, and the polymer is applied in a manner to enter the passages of the spacer.

In accordance with yet another aspect of the present invention, some or all of the pads to be joined to each other have portions extending outwardly from the plane of the corresponding mating surface. The dendrites which are formed by the electric field complete the required conductive paths more quickly, or can be formed with less field intensity, when they are formed on such protruding pads.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE PREFERRED EMBODIMENTS

Figure 1:
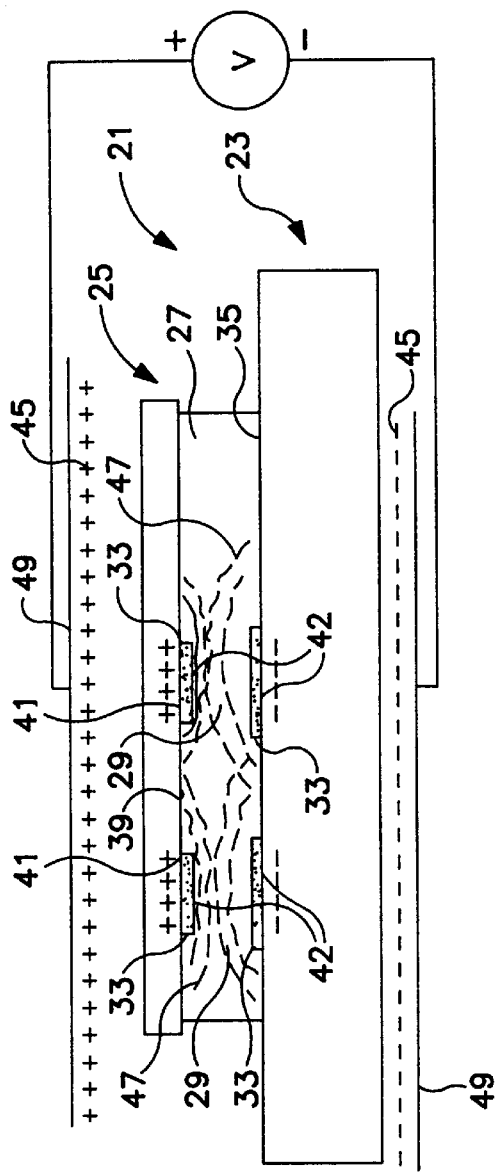
FIG. 1 is a side view of a module or assembly in accordance with the present invention at an intermediate stage of completion.
Figure 2:
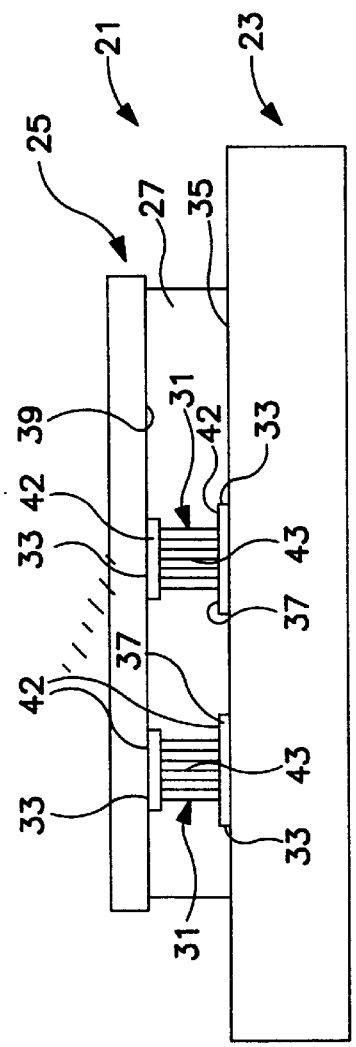
FIG. 2 is a side view of the assembly of FIG. 1 after further processing according to the present invention.

Referring now to the drawing in general, and to FIGS. 1 and 2 in particular, a semiconductor module or assembly 21 includes a carrier 23, such as a ceramic substrate, and a semiconductor device 25, such as a chip, secured to carrier 23. Carrier 23 has a carrier mating surface 35 with an array of associated carrier pads 37 defined on the carrier mating surface 35. The semiconductor device 25, in turn, has a semiconductor mating surface 39 and a corresponding array of device pads 41. For ease of illustration, only two mating pairs 42 of carrier pads 37 and device pads 41 are shown in FIGS. 1 and 2.

Semiconductor mating surface 39 is positioned or placed in an opposing relationship to carrier mating surface 35, with polymer 27 interposed between the semiconductor mating surface 39 and the carrier mating surface 35. More specifically, carrier 23 and device 25 are positioned relative to each other so that device pads 41 oppose corresponding carrier pads 37. In this embodiment, device pads 41 are substantially vertically aligned, as shown in the drawing, with corresponding carrier pads 37.

Significantly, polymer 27 has ionized metallic particles suspended in it. As shown in FIG. 1, polymer 27 has not been cured or set, and the metallic particles are suspended substantially randomly in the polymer 27. An electric field 45, shown schematically by the indication of applied voltage, is applied to assembly 21. As detailed below, the suspension of metallic particles, the characteristics of the electric field 45, and the time of exposure of the assembly 21 to the electric field 45 have been formulated or devised so as to cause certain of the metallic particles to migrate within the polymer 27 toward carrier pads 37 and device pads 41, referred to collectively as pads 33.

The exposure to the electric field 45 causes the metallic particles to migrate into concentrated regions 29 (FIG. 1), and to disassociate from uniform suspension sufficiently to form multiple dendrites 31 extending anisotropically between mating pairs 42 of pads 33. Continued exposure causes continued particle migration and disassociation until dendrites 31 grow sufficiently to electrically connect pads 33 of the mating pad pairs 42 to each other. The dendrites 31 thus formed between mating pad pairs 42 constitute metallurgical bonds 43 between the mating pad pairs 42. Bonds 43 are "metallurgical" in the sense that metal particles have been concentrated and fused together at a microscopic level to form a seamless or boundary-less connection between the two pads of pad pairs 42. Bonds 43 also create corresponding conductive paths between the carrier 23 and device 25.

Further processing is done to set, "freeze", or otherwise cure polymer 27. Once set, polymer 27 structurally reinforces and electrically insulates the plurality of metal dendrites 31 forming the metallurgical bond and the electrical connection between carrier pads 37 and device pads 41.

One preferred method for assembling carrier 23 and semiconductor device 25 in accordance with the present invention is now further detailed. An appropriate polymer 27 is formulated using any of a large number of commercially available die attach polymer materials as a basic matrix, including epoxies, the cyanide esters, and thermoplastics such as a polyimide-siloxane copolymer. Metallic particles, preferably in a size range of about 1 to about 25 micrometers, are added in a volume fraction sufficiently low to avoid formation of lateral conduction paths. Such lateral conduction paths between adjacent ones of either carrier pads 37 or device pads 41 may cause "shorting" of the assembly 21.

A suitable fraction of particles ranges between about 5% to about 20% by volume. Silver is one metal suitable for the metallic particles, but other metals known to migrate under electrical fields are likewise suitable. Copper and nickel are two alternate choices.

In the preferred embodiment, a small concentration of an organic salt of the chosen metal is also added to improve the kinetics of migration. One suitable salt is silver acetate when using silver particles. Another is silver pyrophosphate, selected for having low solubility in water but high solubility in alcohol and organic media. The salt assists in ionic mobility of the polymer particles before setting the polymer, and concentrations ranging from about 0.1% to about 1.0% by weight of the metal particle filler fraction are preferred.

The polymer 27 formulated as described above is then dispensed onto one of the two mating surfaces: carrier mating 35 or semiconductor mating surface 39. In this embodiment, polymer 27 is applied as a film to carrier mating surface 35, which has processing advantages when carrier 23 is to receive multiple semiconductor devices 25 on it, such as in a multi-chip version of assembly 21. A volume of polimer 27 sufficient to give a final film thickness of 1–5 mils is preferred. Although thicknesses beyond the preferred thickness are also suitable, thicker films may require extensive processing time to grow the dendrites 31; films too thin may be of insufficient compliance to support the mismatched strains generated by different thermal coefficients of expansion in chip and carrier materials. Film application can be achieved in any number of ways, from a droplet or pattern that is flattened during chip placement to a doctor-bladed film.

Once the carrier 23 is prepared as above, semiconductor device 25, with matching metallized I/O device pads 41, is aligned over the carrier pads 37 of carrier 23. Semiconductor device 25 is placed with a slight compressive load (0.1 to 1 gram per I/O pad is recommended) to assure good contact of the device pads 41 with the die attach polymer 27. Any of a number of commercially available chip placement tools can be used in this align-and-place operation of device 25.

The module or assembly 21 described above is then placed in the uniform electric field 45, typically created by two parallel plates 49 at different voltages, such that field lines 47 (FIG. 1) will occur substantially parallel to the carrier mating surface 35 and carrier semiconductor mating surface 39. Field strengths on the order of 2–10 Volts/mil are appropriate to induce sufficiently rapid metal migration in the pre-set die attach polymer 27 described above. One preferred way to generate and apply the electric field 45 is as part of a conveyor belt system for high manufacturing throughput. Electric field 45 is effective whether formed from direct current or alternating current.

In this process, metal particles will migrate in such a manner as to complete the conductive path between the mating pad pairs 42. This migration will occur by metal disassociating from the matrix of the polymer and bridging the gaps both between metallic particles and between metallized pad and the particles. In particular, after a suitably long exposure to the electric field 45, the metal particle disassociation and bridging form dendrites 31 of sufficient length so that they extend between opposing pairs of pads 42. The dendrites 31 extend generally perpendicular to electric field lines 47, that is, the dendrites grow anisotropically. Dendrites 31 formed by this process comprise both electrical and metallurgical connections to mating chip and carrier pad pairs 42. The process is continued such that many substantially parallel conductive dendrites 31 form conductive paths and metallurgical bonds for each I/O pad pair 42, as shown schematically in FIG. 2.

The process of dispensing polymer 27 and inducing sufficient migration of metallic particles in polymer 27 is preferably done at temperatures in which polymer 27 is not set, that is, in a "pre-set" form, as shown in FIG. 1. For epoxy-based polymers, temperatures below curing temperatures are used. If a thermoplastic is used as the polymer 27, with metal particles suspended in polymer 27, the process of dispensing such thermoplastic polymer and inducing migration of metallic particles is done at a temperature above the set point so the material is fluid, typically in the range of about 125° C. to about 175° C.

The electric field lines 47 are modified by the presence of the conductive metal pads 33 in such a fashion as to concentrate dendrite growth between mating pad pairs 42, rather than laterally between adjacent carrier pads 37 or device pads 41. Although the process time will be a function of the specific materials, metal fraction, salt fraction, film thickness, and electric field characteristics, metal migration kinetics indicate that process time ranges from 30–1,000 seconds.

Once sufficient metallurgical and conductive bonds have been formed between mating pad pairs 42, polymer 27 is caused to set or cure by appropriate application of light, heat, cold, or like processing. The setting step is a cure, as for an epoxy, or simply cooling the material to room temperature, in the case of a thermoplastic resin. Typical epoxy cures are in the 130° C. to 150° C. ranges for 0.5 to 3 hours.

Once set, the polymer 27 structurally reinforces and electrically insulates the metal dendrites 31 to preserve the required connections between carrier 23 and semiconductor device 25. The polymer 27 thus offers a compliant and robust interface similar in strength to die attach and underfill adhesives currently in use in the microelectronics industry, but with the various advantages over current interconnections apparent from the description set out in this document.

The metallized pads 33 on the carrier 23 and device 25 to be mounted on the carrier 23 are generally comparable in structure and composition to those used for soldering or wire bonding. For example, an overcoating of copper, aluminum, nickel, or gold is suitable. A preferred embodiment is copper-gold on the device 25 when in the form of a chip, and copper-gold or nickel-aluminum on the carrier 23.

Figure 3:
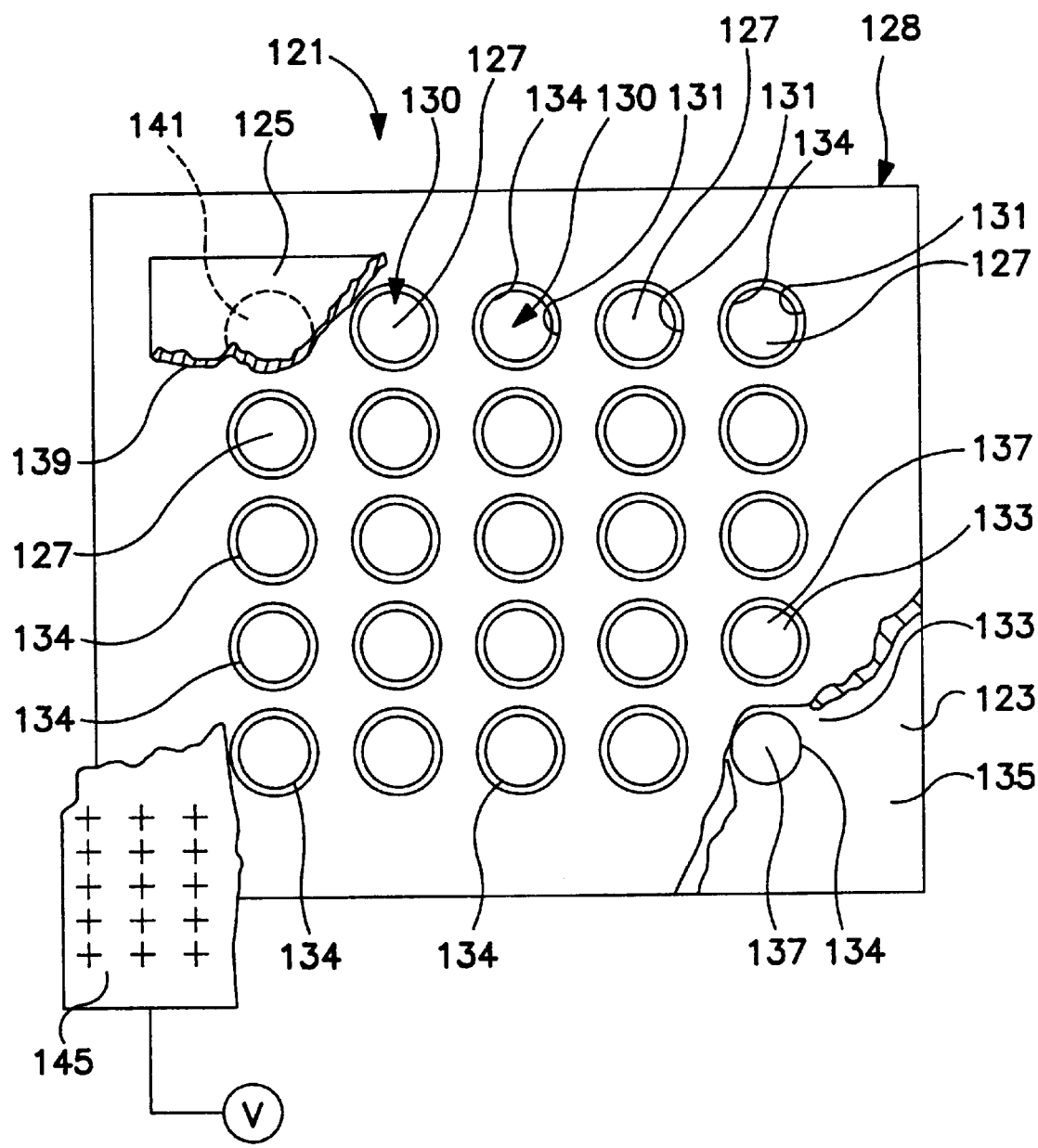
FIG. 3 is a top, plan, partial cut-away view of an alternative embodiment of the present invention.

FIG. 3 shows an alternative embodiment of the present invention, in which a cured polymer sheet or spacer 128 has been interposed between carrier 123 and device 125. Cured polymer sheet or spacer 128 is formed with passages or holes 130, such as by punching. Holes 130 match the array of mating chip and carrier pads 133. The array of passages or holes 130 is aligned with the array of pads 133. Instead of a uniform film of polymer 27 as in the embodiment shown in FIGS. 1 and 2, polymer 127 with metal particles suspended in polymer 127 is placed into holes 130 at a suitable point during processing so as to fill holes 130.

Holes 130 are defined by walls 131 which extend between the opposing mating surfaces of carrier 123 and device 125. Carrier mating surface is shown at 135. Preferably, holes 130 are sized so that walls 131 are outside of the perimeters 134 of corresponding pads 133. At a minimum, walls 131 are coextensive with perimeters 134. Walls 131 are thereby positioned relative to perimeters 134 so that portions of walls 131 extend between the perimeters 134 of adjacent pads 133 on either carrier 123 or device 125.

As such, when the assembly 121 is subjected to electric field 145, walls 131 inhibit lateral migrations of metallic particles between adjacent pads 133 on carrier 123 and device 125. As discussed previously, such lateral migrations are undesirable because they risk forming conductive paths between adjacent pads 133 which, in turn, may cause electrical "shorts."

Holes 130 are shown as substantially circular in cross-section but may have any cross section, so long as the corresponding walls 131 are coextensive with or outside of the outer perimeters 134 of corresponding pads 133. The formulation of polymer 127 is similar to that of polymer 27, except that the structures inhibiting lateral migration allow greater concentrations of suspended particles without risk of generating shorts. Such increased fraction of metallic particles is in the range of about 50% to about 70% by volume. The length of exposure to the electric field 145 is also correspondingly shortened, because sufficient conductive paths are formed more quickly from the higher concentrations of metallic particles.

The polymer spacer 128 is preferably formed from polyimide material. Spacer 128 also preferably includes a contact adhesive on the surfaces of the spacer to be adhered to the opposing, mating surfaces of carrier 123 and device 125. In this embodiment, spacer 128 is placed upon carrier mating surface 135 of carrier 123, and the polymer 127 is then doctor-bladed over the spacer 128, filling the holes 130. Semiconductor device 125 is placed with its semiconductor mating surface 139 opposing and aligned with carrier mating surface 135 so that device pads 141 engage carrier pads 137. Except for the differences noted above, the resulting module or assembly 121 is further processed substantially as described with reference to the preceding embodiment shown in FIGS. 1, and 2.

As a further alternative embodiment, the metal conductive pads 33, 133 may be formed to protrude from the plane of the surfaces on which the pads are defined. Such protrusions may be in the form of prefabricated dendrites or any other extending structure, with the result that field lines 47 are further concentrated. Such further concentration favors dendrite growth between mating pads and shortens the processing time.

In addition to the advantages apparent from the foregoing description, the interconnection method and resulting structure are relatively simple and cost-effective to implement. As a further advantage, the dendrites 31 of the present invention form robust, metallurgical connections as opposed to mechanical bonds or connections. In addition, such interconnections are not only tolerant of surface irregularities on the conductive pads, 33, 133, but such irregularities may in fact enhance dendrite growth according to the present invention. As still another advantage, the method and resulting module or assembly 21, 121, are practiced and built, respectively, with reduced use of lead-based solder during assembly of device 25, 125 to carrier 23, 123.

Although illustrated and described above with reference to certain specific embodiments, the present invention is nevertheless not intended to be limited to the details shown. Rather, various modifications may be made in the details within the scope and range of equivalents of the claims and without departing from the spirit of the invention.

What is claimed is:

1. A method for assembling a carrier and a semiconductor device, comprising:
   a) formulating a die-attach polymer to include therein a low density of ionized metallic particles;
   b) applying the die-attach polymer to a mating surface of at least one of the carrier and the semiconductor device;
   c) positioning pads of the carrier and corresponding semiconductor pads of the semiconductor device in substantially opposing relationship to each other, with the polymer therebetween to define an assembly;
   d) exposing the assembly to an electric field of sufficient strength to produce a controlled migration of the metallic particles to the pads of at least one of the semiconductor device and the carrier to form anisotropic metal dendrites extending from the pads, the dendrites establishing a conductive path and a metallurgical bond between the carrier and the semiconductor device; and
   e) causing the polymer to set so as to structurally reinforce and electrically insulate from each other the metal dendrites of adjacent pads, the metal dendrites defining metallurgical connections between the carrier and the semiconductor device.

2. The method of claim 1, wherein the ionized metallic particles range in size between 1 to 25 micrometers.

3. The method of claim 1, wherein the ionized metallic particles range in a volume fraction of 5% to 20%.

4. The method of claim 3, comprising the step of maintaining the volume fraction sufficiently low to minimize instances of lateral conduction.

5. The method of claim 1, comprising the step of selecting the ionized metallic particles from the group consisting of silver, copper, and nickel.

6. The method of claim 1, comprising the step of forming the die-attach polymer with a small concentration of a metallic salt.

7. The method of claim 6, comprising the step of adding the metallic salt at a concentration of 0.1% to 1.0% by weight of the ionized metallic particles in the polymer.

8. The method of claim 1, wherein the step of applying the polymer comprises the step of forming a film of the polymer with a film thickness of between 1 mil and 5 mils.

9. The method of claim 8, wherein the film is formed by at least one of (a) depositing a pattern of the polymer and flattening the pattern, and (b) doctor-blading the polymer.

10. The method of claim 1, further comprising the step of inhibiting migration of the ionized metallic particles during the application of the electric field.

11. The method of claim 10, wherein the inhibiting step comprises the step of providing a planar spacer of insulating material with passages therethrough at locations corresponding to the pads, and placing the spacer on the mating surface of one of the carrier and the semiconductor device, and wherein the step of applying the polymer comprises filling the passages with the polymer.

12. The method of claim 1, wherein the step of exposing the assembly to an electric field comprises the step of placing the assembly in an electric field having a field strength of 2 to 10 volts per mil.

13. The method of claim 12, further comprising the step of forming a uniform electric field from direct current.

14. The method of claim 12, further comprising the step of forming an alternating electric field from alternating current.

15. The method of claim 1, further comprising the step of providing at least one of the mating surfaces with pads extending from the plane of the mating surface to facilitate the growth of the dendrites.

16. The method of claim 1, wherein the step of formulating the polymer comprises selecting the polymer from the group consisting of epoxies, cyanide esters, and thermoplastics.

\* \* \* \* \*